US011183266B2

(12) United States Patent
Hulton et al.

(10) Patent No.: US 11,183,266 B2
(45) Date of Patent: Nov. 23, 2021

(54) APPARATUSES AND METHODS FOR REPAIRING DEFECTIVE MEMORY CELLS BASED ON A SPECIFIED ERROR RATE FOR CERTAIN MEMORY CELLS

(71) Applicant: MICRON TECHNOLOGY, INC., Boise, ID (US)

(72) Inventors: David Hulton, Seattle, WA (US); Tamara Schmitz, Scotts Valley, CA (US); Jonathan D. Harms, Meridian, ID (US); Jeremy Chritz, Seattle, WA (US); Kevin Majerus, Boise, ID (US)

(73) Assignee: MICRON TECHNOLOGY, INC., Boise, ID (US)

( * ) Notice: Subject to any disclaimer, the term of this patent is extended or adjusted under 35 U.S.C. 154(b) by 151 days.

(21) Appl. No.: 16/453,905

(22) Filed: Jun. 26, 2019

(65) Prior Publication Data
US 2020/0411132 A1   Dec. 31, 2020

(51) Int. Cl.
*G11C 29/00* (2006.01)
*G06F 12/126* (2016.01)
(Continued)

(52) U.S. Cl.
CPC ............ *G11C 29/76* (2013.01); *G06F 3/0659* (2013.01); *G06F 12/0246* (2013.01);
(Continued)

(58) Field of Classification Search
CPC ..... G11C 29/76; G11C 11/408; G11C 11/418; G11C 29/04; G11C 29/4401; G11C 29/44;
(Continued)

(56) References Cited

U.S. PATENT DOCUMENTS 9,627,095 B1   4/2017  Xu et al.
10,037,246 B1   7/2018  Laws et al.
(Continued)

OTHER PUBLICATIONS

Qin et al. "Robustness of Neural Networks Against Storage Media Errors"; arXiv: 1709.06173v1; Sep. 18, 2017, pp. all.
(Continued)

*Primary Examiner* — April Y Blair
*Assistant Examiner* — Sazzad Hossain
(74) *Attorney, Agent, or Firm* — Dorsey & Whitney LLP (57) ABSTRACT

Methods, apparatuses, and systems for repairing defective memory cells in regions of a memory array associated with high or low priority levels are disclosed. A repair address generator may be configured to generate a memory address map for repair (e.g., blowing fuses at a fuse circuit), depending on whether certain applications may operate at a high priority level indicative of a low bit error rate or a low priority level indicative of a higher bit error rate. For example, a specified error rate associated with a low priority level may correspond to a threshold error rate for certain applications, such as a neural network application that stores trained weights. Such neural network applications may access trained weights being partially stored in defective memory cells, with the least significant bits of such trained weights being stored in defective memory cells that are not repaired according to the memory address map.

28 Claims, 7 Drawing Sheets

(51) Int. Cl.
*G06F 12/02* (2006.01)
*G06F 3/06* (2006.01)
*G11C 29/04* (2006.01)
*G06F 12/0813* (2016.01)
*G11C 29/44* (2006.01)
*H04L 29/12* (2006.01)
*G06F 11/10* (2006.01)
*G11C 11/408* (2006.01)
*G11C 11/418* (2006.01)

(52) U.S. Cl.
CPC ........ *G06F 12/126* (2013.01); *G06F 11/1048* (2013.01); *G06F 12/0813* (2013.01); *G11C 11/408* (2013.01); *G11C 11/418* (2013.01); *G11C 29/04* (2013.01); *G11C 29/44* (2013.01); *G11C 29/4401* (2013.01); *G11C 29/787* (2013.01); *H04L 61/2575* (2013.01)

(58) Field of Classification Search
CPC ............... G11C 29/787; G06F 11/1048; G06F 12/0813; G06F 3/0659; G06F 12/0246; G06F 12/126; H04L 61/2575
See application file for complete search history.

(56) References Cited

U.S. PATENT DOCUMENTS

| | | | |
|---|---|---|---|
| 2002/0019959 A1* | 2/2002 | Harada | G11B 19/04 714/42 |
| 2006/0256600 A1 | 11/2006 | Lee | |
| 2007/0279984 A1 | 12/2007 | Mori et al. | |
| 2010/0070696 A1* | 3/2010 | Blankenship | G11C 5/04 711/105 |
| 2010/0329094 A1* | 12/2010 | Ito | G11B 20/10 369/53.42 |
| 2012/0324172 A1* | 12/2012 | Rabinovitch | G06F 12/121 711/136 |
| 2014/0025923 A1* | 1/2014 | Klein | G06F 3/0647 711/207 |
| 2018/0137003 A1 | 5/2018 | Pignatelli et al. | |
| 2019/0073259 A1* | 3/2019 | Qin | G06N 3/063 |
| 2020/0026991 A1* | 1/2020 | Lin | G06N 3/0454 |
| 2020/0035305 A1* | 1/2020 | Choi | G06N 3/063 |
| 2020/0411128 A1* | 12/2020 | Jabeur | G11C 7/12 |

OTHER PUBLICATIONS

ISR/WO dated Sep. 25, 2020 for PCT Application No. PCT/US2020/037246.

* cited by examiner

APPARATUSES AND METHODS FOR REPAIRING DEFECTIVE MEMORY CELLS BASED ON A SPECIFIED ERROR RATE FOR CERTAIN MEMORY CELLS

BACKGROUND

In a semiconductor device such as DRAM (Dynamic Random Access Memory), redundant memory cells are provided in some cases to replace defective memory cells. The addresses of the defective memory cells are stored in fuse circuits. When such addresses are to be accessed, the fuse circuits activate a hit signal. After the hit signal becomes activated, the redundant memory cells are accessed instead of the defective memory cells. For example, all of the defective memory cells may be replaced with the redundant memory cells.

At the same time, high speed memory access and reduced power consumption are features that are demanded from semiconductor devices. In recent years, systems that have adopted multi-core processors for the execution of applications have resulted in faster access patterns to a memory device serving as a main memory (e.g., dynamic random access memory (DRAM)), or any such volatile memory. For example, a typical access pattern to the DRAM repeats bank activation, read access or write access, and bank precharge in the order. Repairs of defective memory cells in such volatile memory are needed for efficient access to such memory devices. The efficiency and performance of a computing device may be affected by different memory devices and the extent to which that memory device may be repaired, e.g., by fuses allocated for such defective memory cells in that memory device.

At the same time, bit flips (e.g., a change in charge at a memory cell) are an occurrence in non-volatile memory devices. As the bits per memory cell increases, a Raw Bit Error Rate (RBER) may indicate worse performance, while the need for better throughput and latency continues to grow. Thus, memory devices may operate with complex error correct correction techniques whose area and power needs are rising; resulting in higher cost silicon and longer firmware development times.

Neural networks may be utilized for computer vision and natural language processing techniques, among a variety of such signal processing applications. While the compute and memory requirements of neural networks continues to grow as they are applied to solve complex compute problems, there is also a need to reduce the complexity (e.g., compute and memory footprint) of such neural networks, for some resource-constrained devices ranging from Internet of Things (IoT) devices & embedded devices, to large compute clusters (e.g., a Graphic Processing Unit (GPU) cluster). In utilizing such a neural network, a machine learning model may be trained on a GPU using a volatile memory device. Weights generated from such training may be stored on either a volatile memory device (e.g., a DRAM memory device) or a non-volatile memory device (e.g., a NAND flash memory device).

DETAILED DESCRIPTION

Neural networks may implemented using memory having a higher bit error rate than may be acceptable in many other applications (e.g., data storage). For example, the performance of neural networks may be somewhat invariant to memory errors. For example, if certain bits in weights used in neural network operations contain bit errors (e.g., due to a bit flip), the neural network may nonetheless perform acceptably. Accordingly, memory having a bit error rate higher than may normally be acceptable may nonetheless be used for neural network applications. For memory that may be used in neural network applications (e.g., memory used to store neural network weights), bit error rate requirements may be relaxed.

In neural network applications that utilize memory to store neural network weights, the bits that are stored for a certain trained weight may be 'flipped' or changed (e.g., from '0' to '1', or '1' to '0') due to a defective memory cell storing the charge for a particular bit incorrectly. While such bit flips may affect the output of a neural network (e.g., a prediction/probability) and may cause the network to misclassify an output (e.g., due to the weight degradation in memory), certain neural networks may be less susceptible to bit flips, such as a Recurrent Neural Network (RNN)-based networks (e.g., Long short-term memory (LSTM) neural network or Gated Recurrent Unit (GRU) neural network). Such RNN-based neural networks may exhibit more tolerance due to bit flips and may be able to sustain higher bit error rates. For example, certain neural networks, trained for image classification, may tolerate bit error rates of up to $10^{-7}$ for memory degradation of trained weights. As another example, certain neural networks, trained for object detection, may tolerate bit error rates of up to $10^{-8}$ for memory degradation of trained weights.

Methods, apparatuses, and systems for repairing defective memory cells are described herein. For example, to repair a defective memory cell, a memory address map may be provided to a repair register of a memory device. The memory address map may indicate which memory addresses memory cells are to be repaired based on a specified error rate for certain memory cells, e.g., addresses of memory cells in a low priority region as compared to memory addresses of a high priority region. Accordingly, a processor and/or memory controller implementing such a memory address map may compare addresses of defective memory cells of the memory device to the memory address map indicating which memory addresses are associated with a high priority level and which are associated with a low priority level. The low priority level may be indicative of which memory addresses are to be accessed for a plurality of memory access operations associated with a specified error rate. For example, memory access operations associated with the specified error rate may be operations that access trained weights of a neural network. Such trained weights of a neural network may not require as stringent of a bit error rate for neural network applications as a bit error rate that may be utilized or required for other memory access operations associated with a high priority level (e.g., accessing other data stored in volatile or non-volatile memory). For example, memory operations (e.g., DRAM operations) may typically require a low bit error rate, where the low bit error rate may be, for example, 10^-19 to 10^-21 BER. However, neural network applications may operate effectively with a higher bit error rate, e.g., from 10^-10 BER, to 10^-4 BER, or even to 10^-3 BER in some examples. Accordingly, the memory controller and/or processor repairing defective memory cells may repair memory addresses associated with the high priority level to accomplish a low bit error rate; while repairing only a portion of the memory addresses associated with the low priority level, because applications (e.g., neural network applications) accessing data from low priority memory cells may be able to tolerate a higher bit error rate.

As described herein, advantageously, repair operations being performed or implemented in a processor or memory controller may include identifying certain memory addresses as a high priority level, including the most significant bits (MSBs) of each memory address. With such identification, a memory address map may be generated by aligning the most significant bits of each memory address in the memory address map, e.g., as indicated by a memory identifier. For example, a memory identifier may be a page of the memory device (e.g., a DRAM page) or a block of a memory device (e.g., a NAND non-volatile block). Accordingly, memory addresses of memory devices may correspond to physical memory addresses or virtual memory addresses. In various implementations, memory identifiers may be utilized for various memory devices, such as DRAM, SRAM, NAND, resistive, or phase change memory devices.

Some repair operations may also be performed for addresses, in the memory map, associated with a low priority level, e.g., as fuses are available in the memory device for such repair. Accordingly, some addresses associated with a low priority level may not be repaired—those associated with a specified error rate, e.g., for use in memory access operations of various neural network applications. In such a case, advantageously, one or more least significant bits (LSBs) of trained weights may be stored in some defective memory cells that are not repaired. In storing bits of trained weights for neural network applications in some defective memory cells, memory devices may be efficiently utilized, in that, for example, some memory devices may not be discarded post-repair or after manufacturing because the bit error rate requirements may not be as high. Accordingly, such memory devices including some defective memory cells, e.g., for use in neural network applications, may still be utilized. In contrast to a typical manufacturing scheme or post-repair evaluation, such memory devices, still having defective memory cells, may be discarded from use, thereby increasing semiconductor device waste. Accordingly, the apparatuses and methods described herein may facilitate the efficient use of memory devices having designated low priority regions intended for use by applications that are tolerant of a higher bit error rate than other memory access operations (e.g., operations which require a DRAM bit error rate of 10^-19 to 10^-21 BER). Additionally or alternatively, such systems and methods may be used to implement IoT devices, which may have lower compute requirements and utilize and/or require a smaller memory footprint than other electronic devices.

Figure 1:
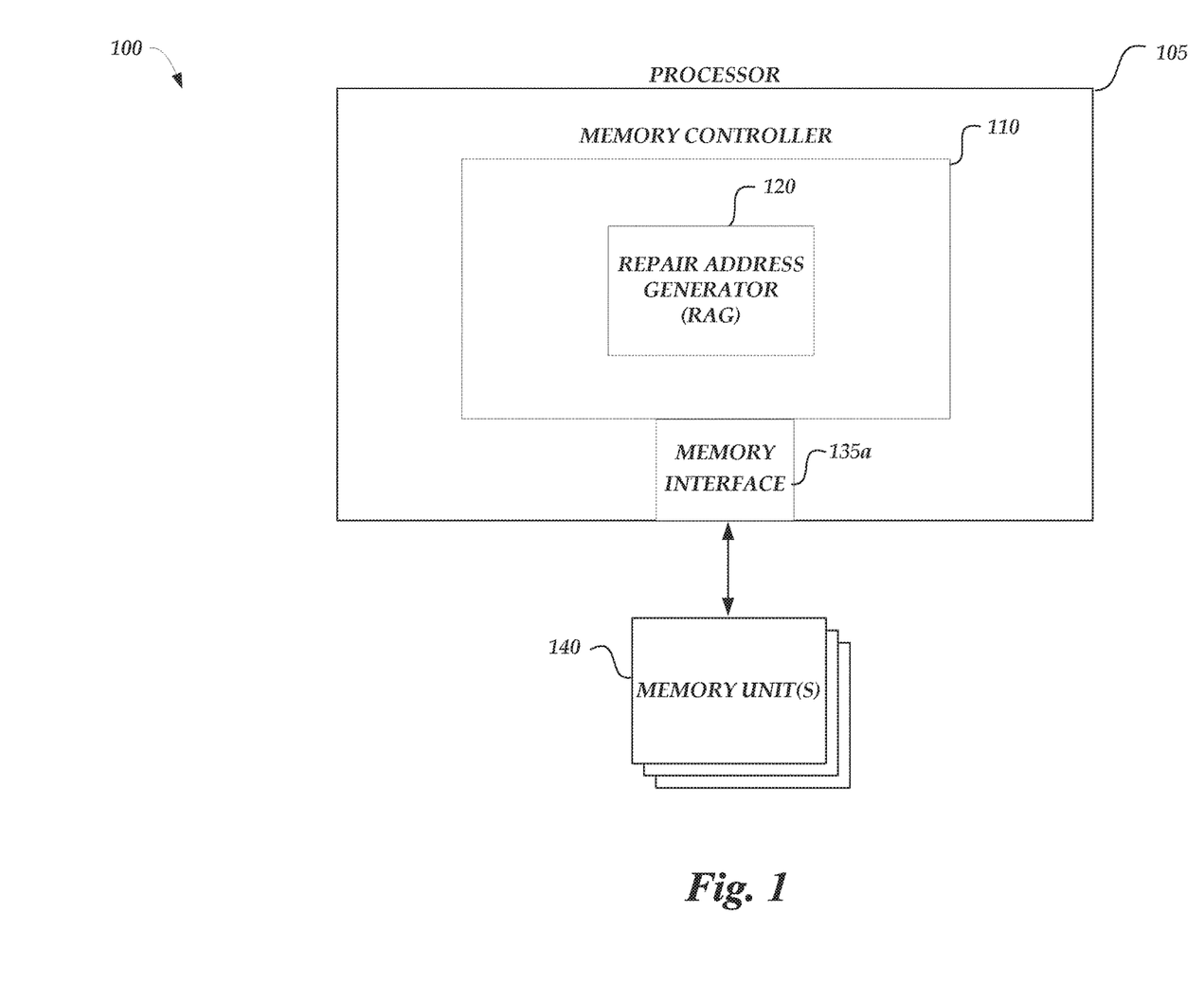
FIG. 1 is a block diagram of a computing system arranged in accordance with examples described herein.

FIG. 1 is a schematic illustration of a computing system 100 arranged in accordance with examples described herein. The computing system 100 includes a processor 105 coupled to memory units 140, which may also be referred to as memory devices. For example, one of the memory units 140 may be a SRAM memory device and another memory unit 140 may be a NAND flash memory device. The processor may implement a repair address generator (RAG) that generates a memory address map to repair certain memory cells associated with memory addresses utilized by various memory access operations, some memory access operations of which are based partly on a specified error rate for a particular memory application (e.g., a neural network application). The memory controller 110 may be coupled to the memory units 140 via memory interface 135. The processor 105 may implement memory commands received from various data sources or processes being executed on the processor 105. For example, the processor 105 may receive memory access requests (e.g., read or write commands) from a process being executed on the processor 105. In such a case, the memory controller 110 may process the memory access requests, as implemented by the processor 105, to access one or more of the memory units 140.

The processor 105 may be used to implement a memory system of the computing system 100 utilizing the memory controller 110. The processor 105 may be a multi-core processor in some examples that includes a plurality of cores. The plurality of cores may for example be implemented using processing circuits which read and execute program instructions independently. The memory controller 110 may handle communication with the memory system that may be outside of the processor 105. For example, the memory controller 110 may provide access commands to the memory units 140 from the plurality of cores of the processor 105. The memory controller 110 may provide such access commands via memory interfaces 135. For example, the memory interface 135 may provide a clock signal, a command signal, and/or an address signal to any of the memory units 140.

In a typical memory access scheme, the memory controller 110 provides instructions to write data to the memory units 140 according to a write command. Similarly, for a read command, the memory controller 110 provides instructions based on a read command and receives the data from the memory units 140. As described herein, in certain cases, the repair address generator 120 generates a memory map for memory access operations—some memory access operations are associated with a high priority level and other memory access operations, having a specified error rate, are associated with a low priority level. For example, to generate a memory map for repair of certain memory addresses, the RAG 120 may obtain a memory access pattern associated with memory access operation of both the high and low priority levels.

The memory access pattern obtained by the RAG 120 may be indicative of which regions of a memory unit are accessed more frequently than other regions of the memory unit. Regions of the memory unit may include memory cells, including defective memory cells. The RAG 120 may associate the regions of the memory unit that are accessed more frequently than other regions of the memory unit as regions associated with a high priority level, while the other regions of the memory unit are associated with a low priority level. Accordingly, the RAG 120 may identify, in the memory address pattern, a first portion of memory addresses associated with the regions of the memory unit being accessed more frequently than other regions of the memory unit as a high priority level; and may identify a second portion of memory address not associated with the regions of the memory unit being accessed more frequently than other regions of the memory unit as a low priority level. Once the memory address map is generated, the memory controller 110 may provide the memory address map to a repair register or cache of one or more of the memory units 140 (e.g., a repair register 214 of FIG. 2 described below).

The memory controller 110 may be implemented using circuitry which controls memory access operations to/from the memory units 140. The memory controller 110 may be a separate chip or integrated circuit coupled to the processor 105 or being implemented on the processor 105, for example, as a core of the processor 105 to control the memory system of the computing system 100. In some embodiments, the memory controller 110 may be integrated into the processor 105 to be referred to as integrated memory controller (IMC).

The memory controller 110 may communicate with a plurality of memory units to implement a memory system with the processor 105. For example, the memory units 140, may communicate simultaneously with the memory controller 110. Accordingly, the memory controller 110 may access the memory units 140a based on the generated memory map that is indicative of which certain memory cells associated with certain memory addresses are repaired. For example, the memory controller 110 may access a first region of the memory unit 140 to implement a memory command, with the first region of the memory unit 140 being characterized by a specified error rate for some memory access operations (e.g., neural network access operations). The specified error rate may correspond to a threshold error rate for storing weights of a neural network. In an example implementation, the threshold error rate for storing weights of the neural network is based on a bit flip tolerance of the neural network. In such an example, the threshold error rate may be a raw bit error rate in a range from $10^{-6}$ to $10^{-2}$ BER for a resistive memory device (e.g., a 3D XPoint memory device); or may be a raw bit error rate of $10^{-8}$ in a single-level cell memory device. Various raw bit error rates may be a threshold error rate as determined for various applications. In an example, triple-level cell (TLC) or quad-level cell (QLC) NAND memory devices may have different or the same threshold error rates. Continuing in the example, the memory controller 110 may access a second region of memory unit 140 to implement another memory command, with the second region of the memory unit 140 not being characterized by the specified error rate or having a default error rate (e.g., a default error rate that is used for high priority level regions). For example, the default error rate may be another threshold error rate associated, generally, with other memory access operations, different than the memory access operations associated with storing weights of the neural network.

While the example of FIG. 1 depicts three memory units 140, it can be expected that the memory controller 110 may interact with any number of memory units. For example, eight memory units may be included and each memory unit may include a data bus having an eight-bit width, thus the memory system implemented by the processor 105 may have a sixty-four bit width. The memory units 140 may be dynamic random-access memory (DRAM) or nonvolatile random-access memory (RAM), such as ferroelectric RAM (FeRAM), spin-transfer-torque RAM (STT-RAM) phase-change RAM (PCRAM), resistance change RAM (Re-RAM), or the like. In various embodiments, such memory units may be referred to as memory chips, memory modules, memory dies, memory cards, memory devices, memory arrays, and/or memory cells. Physically, the memory units 140 may be arranged and disposed as one layer, or may be disposed as stacked layers. In some embodiment, the memory units 140 may be disposed as multiple layers, on top of each other, to form vertical memory, such as 3D NAND Flash memory (e.g., 3D XPoint memory device).

In some examples where the memory units 140 may be implemented using DRAM or non-volatile RAM integrated into a single semiconductor chip, the memory units 140 may be mounted on a memory module substrate, a mother board or the like. For example, the memory units 140 be referred to as memory chips. The memory units 140 may include a memory cell array region and a peripheral circuit region. The memory cell array region includes a memory cell array with a plurality of banks, each bank including a plurality of word lines, a plurality of bit lines, and a plurality of memory cells arranged at intersections of the plurality of word lines and the plurality of bit lines. The selection of the bit line may be performed by a plurality of column decoders and the selection of the word line may be performed by a plurality of row decoders.

The memory controller 110 may interact with the memory interface 135 to provide memory commands to implement various memory access operations, as well as any clock signals, command signals, and/or an address signals to any of the memory units 140. For example, the respective peripheral circuit region of the memory units 140 may include dock terminals, address terminals, command terminals, and data input/output (I/O) terminals (DQ). For example, the data I/O terminals may handle eight-bit data communication. Data input output (I/O) buffers may be coupled to the data input/output terminals (DQ) for data accesses, such as read accesses and write accesses of memories. The address terminals may receive address signals and bank address signals. The bank address signals may be used for selecting a bank among the plurality of banks. A row address and a column address may be provided as address signals. The command terminals may include a chip select (/CS) pin, a row address strobe (/RAS) pin, a column address strobe (/CAS) pin, a write enable (/WE) pin, and/or the like. A command decoder may decode command signals received at the command terminals from the memory controller 110 via the memory interface 135, to receive various commands including a read command and/or a write command. Such a command decoder may provide the control signals corresponding to the received commands to control the memory cell array region. The clock terminals may be supplied with an external clock signal, for example from the memory interface 135. An example implementation is described with respect to FIG. 2.

Advantageously, in some examples, the systems and methods described herein may be utilized as a memory access scheme in processing of memory commands for applications that may have a specified error rate (e.g. a neural network application). Neural network-based processing may including training and associated computation of various weights. In some applications, trained weights may be stored in a region of a memory device 140 such that the LSBs of the trained weights are stored in defective memory cells that have not been repaired as indicated in the memory address map. For example, in a page of DRAM memory device 140, trained weights may be aligned by their respective MSBs such that the remaining LSBs are stored in the defective memory cells.

While the repair address generator 120 has been described in the context of an implementation of the processor 105 as part of the memory controller, it can be expected that the repair address generator 120 may also be implemented differently in other embodiments. For example, the repair address generator 120 may be coupled to the processor 105 as a separate circuit such as an application specific integrated circuits (ASIC), a digital signal processor (DSP) implemented as part of a field-programmable gate array (FPGA), or a system-on-chip (SoC). As another example, the repair address generator 120 may be coupled to the memory controller 110, being implemented by the processor 105, as a series of switches that determine the sequence of instructions that are to be provided to a repair register or local cache of a memory unit 140. For example, a local cache of the memory unit 140 may be an L2 cache. The switches may be multiplexors, for example, with selected lines coupled to the memory controller 110.

Figure 2:
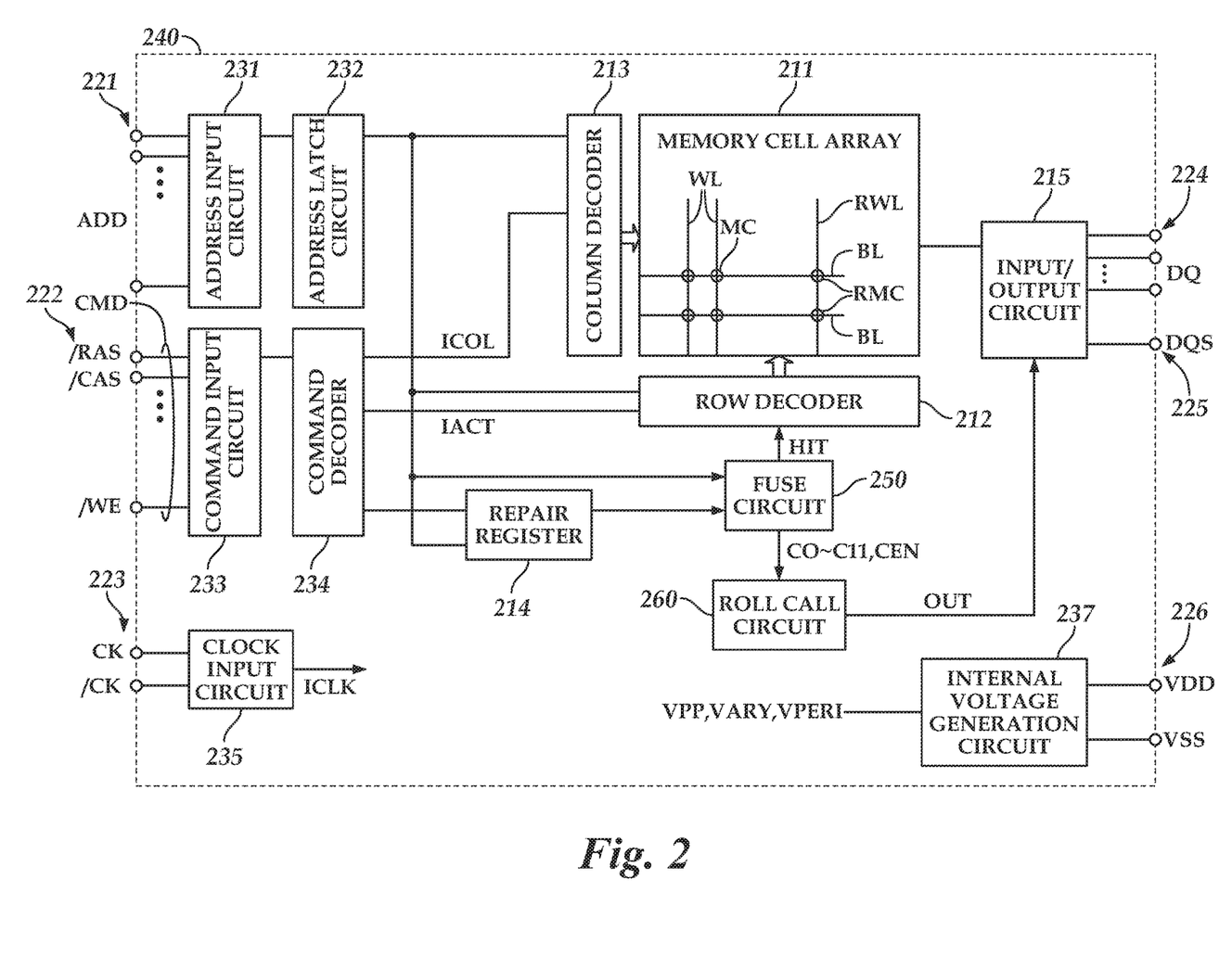
FIG. 2 is a block diagram of a memory device arranged in accordance with the examples described herein.

FIG. 2 is a block diagram of a memory unit 240 arranged in accordance with the examples described herein. The memory unit 240 includes a memory cell array 211 comprising a plurality of word lines WL to which different memory addresses are respectively assigned, and a plurality of bit lines BL to which different memory addresses are respectively assigned. The memory cell array 211 also includes memory cells MC which are respectively located at the intersections of the word lines WL and the bit lines BL. The word lines WL are selected by a row decoder 212. The bit lines BL are selected by a column decoder 213. The memory cell array 211 also includes redundant word lines RWL. At the intersections of the redundant word lines RWL and the bit lines BL, redundant memory cells RMC are respectively disposed. The redundant word lines RWL are spare word lines each of which can replaces a defective word line WL or a word line WL that is connected to a defective memory cell MC. While FIG. 2 depicts shows one redundant word line RWL, the memory cell array 211 may include any number of redundant word lines, e.g., 178 RWLs.

Continuing with reference to FIG. 2, the memory unit 240 includes external terminals that include address terminals 221, command terminals 222, clock terminals 223, data terminals 224, a data strobe terminal 225, and power supply terminals 226. For example, the address terminals 221 may be supplied with an address signal ADD from a memory controller (e.g., memory controller 110 of FIG. 1). The address signal ADD that is input to the address terminals 221 is supplied to an address latch circuit 232 via an address input circuit 231. The address signal ADD may be latched by the address latch circuit 232. The address signal ADD latched by the address latch circuit 232 is supplied to the row decoder 212, the column decoder 213, the repair register 214, and/or the fuse circuit 250.

Figure 5:
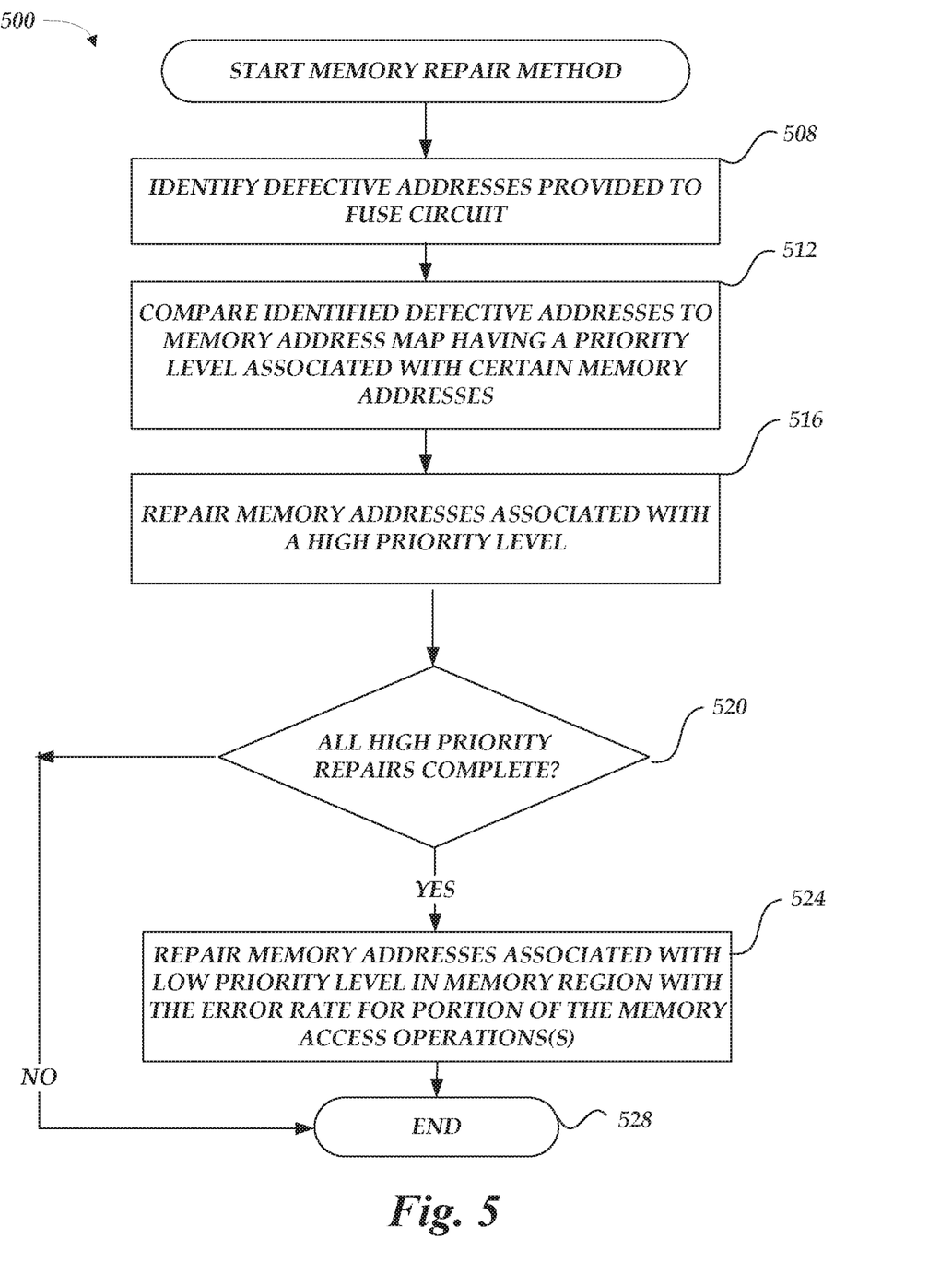
FIG. 5 is a flowchart of a method arranged in accordance with examples described herein.

The repair register 214 may receive memory addresses from the address signal ADD. For example, the repair register 214 may receive a memory map indicative of a memory cells to be repaired for high priority regions of the memory array 211 and certain low priority regions of the memory array 211, such that low priority regions of the memory array 211 may operate in accordance with a specified error rate. In some examples, the repair register may be a memory data register (MDR). The repair register 214 may receive such a memory map from a repair address generator of a memory controller (e.g., RAG 120 of memory controller 110). In some implementations, the fuse circuit 250 may provide a memory controller a look-up table and/or listing indicative of which fuses of fuse circuit 250 have been blown. In such implementations, a memory controller may utilize such a look-up table to determine whether all high priority level repairs have been completed (e.g., as described with respect to decision block 520 of method 500). In accordance with such a determination, updated memory maps may be generated by a repair address generator and provided to a local cache or repair register (e.g., repair register 214) of the memory unit 240.

The command terminals 222 are supplied with a command signal CMD from a memory controller (e.g., memory controller 110 of FIG. 1). The command signal CMD may include of a plurality of signals, such as a row address strobe signal /RAS, a column address strobe signal /CAS, and a write enable signal /WE. The names of the signals that start with slash (/) indicate that those signals are inverted signals of corresponding signals or low-active signals. The command signal CMD that is input to the command terminals 222 is supplied to a command decoder 234 via a command input circuit 233. The command decoder 234 generates various internal commands by decoding the command signal CMD. The internal commands may include an active signal IACT, a column signal ICOL, and a repair signal to be provided to a repair register 214.

The active signal IACT is activated when the command signal CMD indicates row access (active command). After the active signal IACT becomes activated, the address signal ADD latched by the address latch circuit 232 is supplied to the row decoder 212. As a result, a word line WL specified by the address signal ADD is selected. The column signal ICOL may be activated when the command signal CMD indicates column access (read command or write command). After the column signal ICOL becomes activated, the address signal ADD latched by the address latch circuit 32 is supplied to the column decoder 213. Accordingly, a bit line BL specified by the address signal ADD may be selected.

If the active command and the read command are input in this order and the row address and the column address are input in synchronization with the commands, read data may be read from a memory cell MC specified by the row and column addresses. The read data DQ is output from the data terminals 224 via an input/output circuit 215 in synchronization with the data strobe signal DQS output from the data strobe terminal 225. If the active command and the write command are input in this order, the row address and the column address are input in synchronization with the commands, and write data DQ is input to the data terminals 224 in synchronization with the data strobe signal DQS, the write data DQ is supplied to the memory cell army 211 via the input/output circuit 15. Such write data DQ may be written into a memory cell MC specified by the row and column addresses.

The clock terminals 223 may be supplied with external clock signals CK and /CK. The external clock signal CK and the external clock signal /CK are complementary to each other, both are supplied to a clock input circuit 235. The clock input circuit 235 may generate an internal clock signal ICLK based on the external clock signals CK and /CK. The internal clock signal ICLK may be used as a timing signal for the address latch circuit 232, the command decoder 234, as well as other internal circuits of the memory unit 240.

The power supply terminals 226 may be supplied with power supply potentials VDD and VSS, which, in turn, may be internal voltage generation circuit 237. The internal voltage generation circuit 237 may generate various internal potentials, such as VPP, VARY, and VPERI, based on the power supply potentials VDD and VSS. For example, the internal potential VPP may be used in the row decoder 212. The internal potential VARY may be used in the memory cell array 211. The internal potential VPERI may be used in other circuits of the memory unit 240.

Continuing with reference to FIG. 2, the memory unit 240 also includes the fuse circuit 250 and a roll call circuit 260.

The fuse circuit 250 may store an address of a defective word line WL. The defective word line WL may be not only a word line WL that itself is defective, but also a word line WL connected to a defective memory cell MC. An address signal ADD (e.g., row address) at the time of row access is input to the fuse circuit 250. The repair register 214 may also provide certain memory addresses to be repaired to the fuse circuit 250. Accordingly, the fuse circuit 250 may compare the input row address to the memory addresses of the repair register 214; and, according to the methods described herein, may identify memory addresses to be repaired. When a memory address is to be repaired according to whether it is a high priority level or a low priority level, a hit signal HIT is activated. For example, in repairing a portion of the memory addresses associated with the low priority level, the fuse circuit 250 may blow fuses associated with memory address that are indicative of respective MSBs of trained weights of a neural network. In some implementations, the fuse circuit 250 may not blow fuses associated with memory addresses that are indicative of respective LSBs of those trained weights of the neural network. In repairing the portion of the memory addresses associated with the high priority level, the fuse circuit 250 may blow all available fuses to repair such defective memory addresses, for example, before repairing any addresses at a low priority level.

The hit signal HIT may be supplied to the row decoder 212, which is an access control circuit. When the hit signal HIT is not activated, the row decoder 212 selects a certain word line WL based on a row address supplied through the address latch circuit 232. When the hit signal HIT is activated, the row decoder 212 selects a certain redundant word line RWL based on the hit signal HIT. This operation leads to substitute access to the redundant word line RWL, not to the defective word line WL, when access to the defective word line WL is requested.

Figure 3:
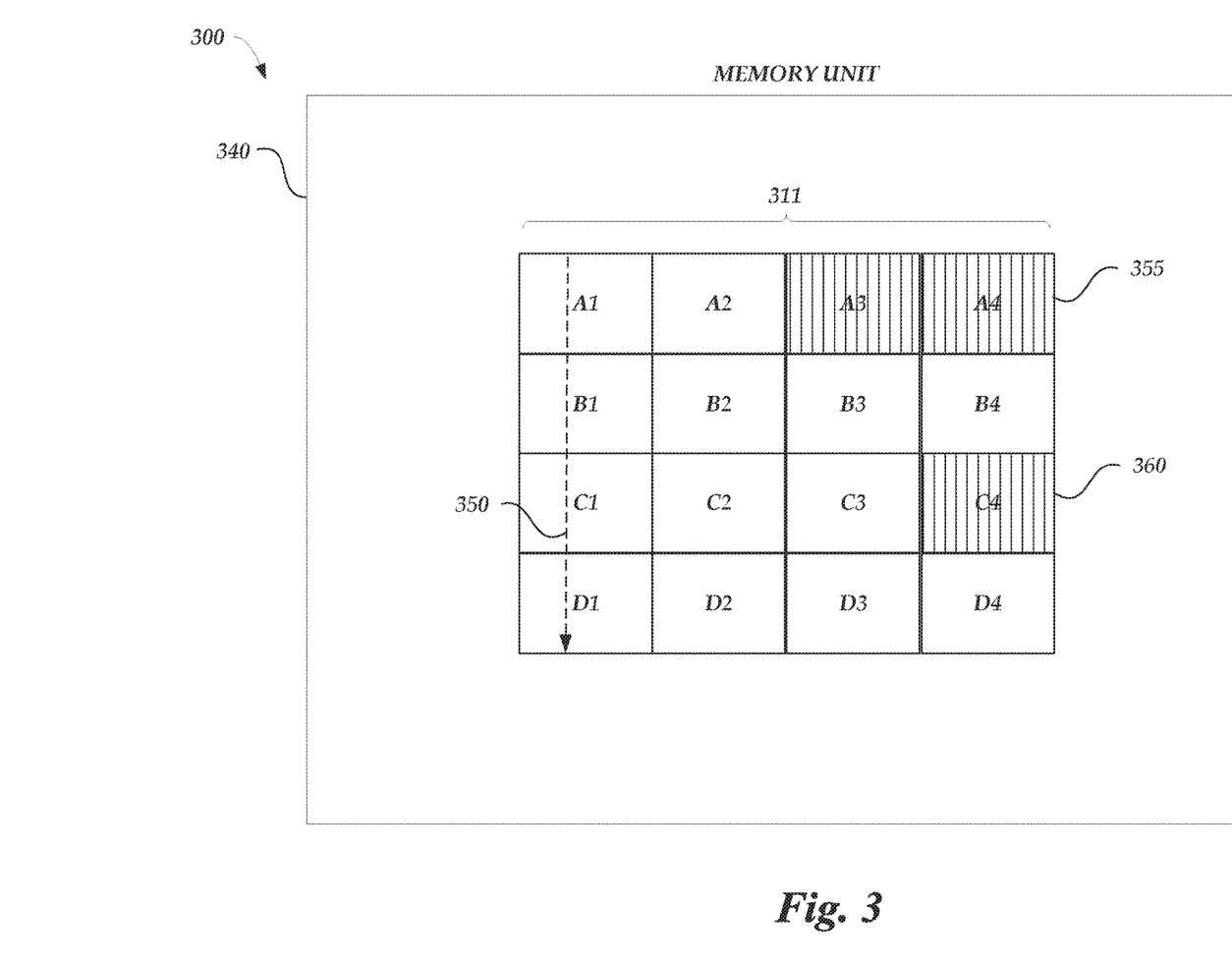
FIG. 3 is a block diagram of a memory device arranged in accordance with the examples described herein.

FIG. 3 is a block diagram of a memory unit 340 arranged in accordance with the examples described herein. A computing system 300 may include a memory unit 340. For example, the computing system 100 with memory units 140 may be implemented as the computing system 300 with one or more memory units 340. Memory unit 340 includes a memory array 311, like that of memory array 211 of memory unit 240. In accordance with the systems and methods described herein, data may be stored to be read/written in memory access operations utilizing the memory array 311. In accordance with such methods, memory array 311 may depict all or a portion of a memory array that stores data associated with a low priority levels, such as a low priority region of a memory array. In the example, memory cells A3 & A4 355 and C4 360 are defective memory cells that are not repaired in accordance with a memory map that memory unit 340 implemented. Memory cells A1-D1, A2-D2, A3-D3, and A4-D4 may be associated with physical memory addresses of a page of volatile memory (e.g., DRAM memory). Accordingly, in a neural network application, trained weights may be aligned by their respective MSBs. As depicted, identifier 350 indicates an alignment of the MSBs of data stored in the rows of the memory army 311. For example, identifier 350 may align MSBs along a page of memory that is addressed according to a physical location of the memory array 311. In aligning the MSBs along the identifier 350, the trained weights may be stored in each row, such that the LSBs of the weights stored in row A and row C are partially stored in the defective memory cells. For example, two LSBs of a trained weight stored in row A may be stored in the defective memory cells A3 & A4 355. Similarly, the LSB of another trained weight stored in row C may be stored in the defective memory cell 360.

Figure 4:
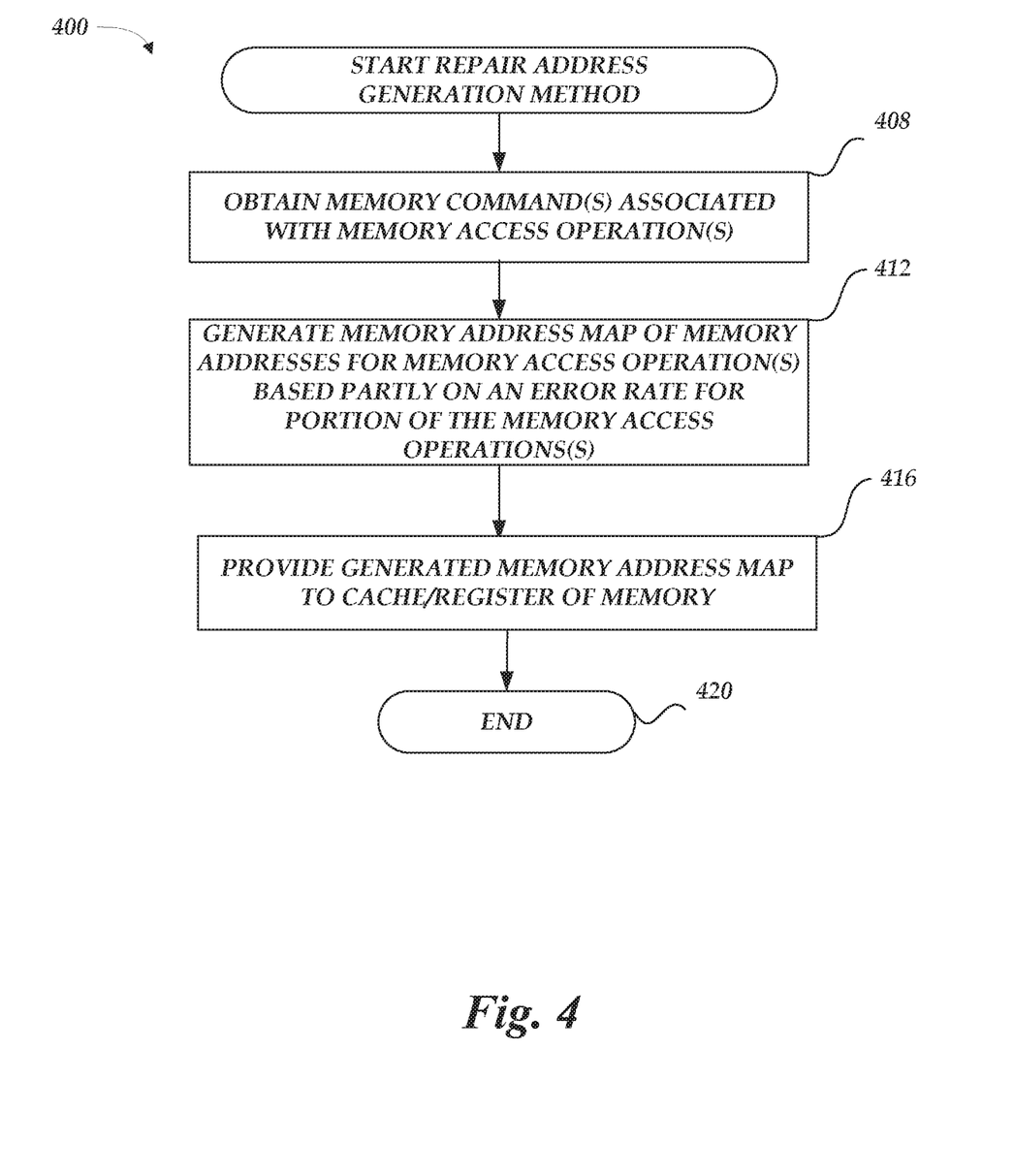
FIG. 4 is a flowchart of a method arranged in accordance with examples described herein.

FIG. 4 is a flowchart of a repair address generation method 400 arranged in accordance with examples described herein. The method 400 may be implemented by a repair address generator, such as the repair address generator 120 of FIG. 1. The method 400 may include a block 408 that recites "obtain memory command(s) associated with memory access operations(s)." An operation or process being performed by a processor, such as processor 105, may obtain or receive a memory command from that operation or process to read or to write to a memory unit, like memory unit 140, 240, or 340, for example. A read or write operation of a process or program being implemented on the processor 105 may be a memory access operation that sends a read or write command to the memory controller 110. The read or write command may comprise a respective memory access operation (e.g., read or write). For example, the memory controller 110 may obtain a write command to write data to the memory units 140. The memory controller 110 may also obtain a read command to read data stored at the memory units 140.

Block 408 may be followed by block 412 that recites "generate memory address map or memory addresses for memory access operation(s) based partly on an error rate for portion of the memory access operations." A repair address generator of a memory controller, such as the repair address generator 120, may generate memory addresses to be repaired depending on whether certain applications may operate at a high priority level indicative of a low bit error rate or a low priority level indicative of a higher bit error rate. In the examples described herein, a repair address generator may generate the memory addresses based a specified error rate. For example, the specified error rate may be a threshold error rate for a particular application, such as a neural network application. The neural network application may utilize stored trained weights, and those trained weights may be stored in a low priority area of the memory having a higher bit error rate. Accordingly, one or more LSBs of the respective trained weights may be stored in defective memory cells that are not to be repaired, e.g., as indicated by the memory address map.

In some examples, at block 412, a repair address generator may also identify and/or associate certain regions of memory with high or low priority levels indicative of the specified error rate for the region. For example, a repair address generator may obtaining a memory access pattern associated with a plurality of memory access operations, where the memory access pattern is indicative of certain regions of the memory unit that are accessed more frequently than other regions of the memory unit. Using that memory address pattern, the repair address generator may identify a first portion of memory addresses associated with the regions of the memory unit being accessed more frequently than other regions of the memory unit, to generate those memory addresses as a high priority level of the memory address map. The repair address generator may also identify a second portion of memory addresses not associated with the regions of the memory unit being accessed more frequently than other regions of the memory unit, to generate those memory addresses as a low priority level of the memory address map. For example, the second portion of memory addresses not associated with the regions of the memory unit being accessed more frequently than other regions of the memory unit may be memory addresses where data may be stored for applications that do not need to operate with a low bit error rate. For example, a neural network application may tolerate a certain number of bit flips that corresponds to a threshold error rate, which may be a specified error rate. That specified error rate may be higher than that of applications that operate with a low bit error rate, e.g., for typical memory access schemes. Advantageously, in generating such a memory address map indicative of addresses to be repaired in high priority regions and some addresses to be repaired in low priority regions, the method 500 may facilitate the efficient use of memory devices having designated low priority regions that may allow the use of applications that do not operate with a bit error rate as utilized in a typical memory access scheme (e.g., a DRAM bit error rate of $10^{-19}$ to $10^{-21}$), but rather may still operate effectively with a higher bit error rate. The method 400 ends at block 420 after the block 416.

FIG. 5 is a flowchart of a memory repair method 500 arranged in accordance with examples described herein. The method 500 may be implemented by a memory controller, such as the memory controller 110 of FIG. 1; or by a processor such as processor 605 or processor 705 of FIGS. 6 and 7, respectively. The method 500 may include a block 508 that recites "identify defective addresses provided to fuse circuit." A fuse circuit 250 may receive a list of defective addresses from a memory controller based on defective memory cells identified in a memory cell array, such as memory cell array 211. The fuse circuit may identify such addresses as defective, which may be repaired according to a memory address map provided by the memory controller to a repair register, such as repair register 214. For example, a memory controller may provide addresses, as a memory address map, to the repair register 214. When the repair register 214 receives a command from the command decoder 234, the memory addresses stored at the repair register 214 may be provided to the fuse circuit 250.

Block 508 may be followed by block 512 that recites "compare identified defective addresses to a memory address map having a priority level associated with certain memory addresses." The fuse circuit 250 may compare the identified defective memory addresses to the addresses of the memory address map comprising addresses associated with a high priority level, a low priority level, or various priority levels. For example, a specific memory address of a memory cell in a high priority region of the memory unit 140 (e.g., a region having an access pattern associated with a high priority level) may be mapped to a defective memory cell as provided in the list of defective memory addresses. In some examples, the comparing may include comparing one or more addresses of defective memory cells of the memory unit to the memory address map. Accordingly, such a comparison match by the fuse circuit 250 may be indicated with a HIT signal, indicative that a repair of the defective memory cell should occur.

Block 512 may be followed by block 516 that recites "repair memory addresses associated with a high priority level." Accordingly, the fuse circuit 250, having compared and determined matches of defective memory addresses of high priority regions of the memory unit 140, may repair the memory addresses associated with a high priority level based on the comparison. For example, a fuse of fuse circuit 250 may be blown such that the defective memory address is mapped to a different memory cell having a memory address associated with the blown fuse. Accordingly, when the defective memory address is to be accessed, the blown fuse may route the access to the non-defective memory cell in the memory cell array 210. In various implementations, the fuse circuit 250 may utilize various loops that prioritize repairs in the high priority regions. For example, the fuse circuit 250 may prioritize single memory cells to be repaired in a column or row of the array, such that specific bits stored at those single memory cells are repaired first and then others memory cells in that high priority region may be repaired afterwards.

Block 516 may be followed by a decision block 520 that recites "all high priority repairs complete?" The fuse circuit 250 may continue to repair high priority regions in a similar manner, also proceeding through all high priority regions. If all high priority regions repairs are complete, then at decision block 520, the flow of the method 500 proceeds along the 'YES' route to the block 524. If not all high priority regions repairs are completed, the flow of the method 500 proceeds along the 'NO' route, to end the method 500, such that the memory unit 140 having the fuse circuit 250 is failed because all fuses of fuse circuit 250 have been utilized, with at least one high priority defective memory cell having not been repaired. For example, if in the last high priority regions, the fuse circuit 250 has no further fuses to be blown to repair the last memory cell of that last high priority region, the method 500 will proceed along the 'NO' route, ending the memory repair method 500, with the memory unit 140 being discarded. Accordingly, the memory unit 140 may not be utilized if not all memory addresses in all high priority regions are repaired to operate according a threshold error rate, e.g., a default error rate, such a low bit error rate for reading and writing data to memory for typical memory access schemes. For example, the fuse circuit 250 may determine whether the threshold error rate has been passed.

Advantageously, however, in some examples, the method 500 may proceed along the 'YES' route to block 524, allowing the memory unit 140 to not be discarded as semiconductor waste, but to repair, as there are available fuses, additional defective memory addresses associated with one or more low priority regions of the memory unit 140. Accordingly, block 520 may be followed by block 524 that recites "repair memory addresses associated with low priority level in memory region with the error rate for portion of the memory access operation(s)." In some examples, if there are no available fuses (e.g., all fuses at fuse circuit 250 have been blown), the method 500 proceeds to end at block 528, with the memory addresses associated with low priority levels not having been repaired. In such a case, the fuse circuit 250 may determine whether a fuse element threshold has been passed (e.g., a number of available fuses to blow). Accordingly, block 524 may be viewed as an optional block of method 500.

In some examples, though at block 524, the fuse circuit 250 may additional blow fuses to repair memory addresses associated with low priority levels in a memory region with a specified error rate for certain memory access operations. For example, in neural network applications, defective memory addresses associated with MSBs of trained weights may be repaired. To repair such defective memory addresses, the fuse circuit 250 may identify the MSBs in the memory address map, with the memory addresses pointing to the MSBs having been aligned along a page or a block of the memory array. Accordingly, the fuse circuit 250 may blow fuses associated with the memory addresses pointing to the MSBs of the low priority regions of memory unit. In repairing the addresses pointing to the MSBs first, some of the defective memory addresses associated with the LSBs of the trained weights may not be repaired (e.g., there are no additional fuses to be blown in the fuse circuit 250). Accordingly, for neural network applications accessing the low priority region of the memory array, the memory unit 140 may operate with a specified bit error rate for that neural network application, e.g., a higher bit error rate than the high priority regions operating according to a low bit error rate. The method 500 ends at block 528 after the block 524.

The blocks included in the described example methods 400 and 500 are for illustration purposes. In some embodiments, the blocks may be performed in a different order. In some other embodiments, various blocks may be eliminated. In still other embodiments, various blocks may be divided into additional blocks, supplemented with other blocks, or combined together into fewer blocks. Other variations of these specific blocks are contemplated, including changes in the order of the blocks, changes in the content of the blocks being split or combined into other blocks, etc.

Figure 6:
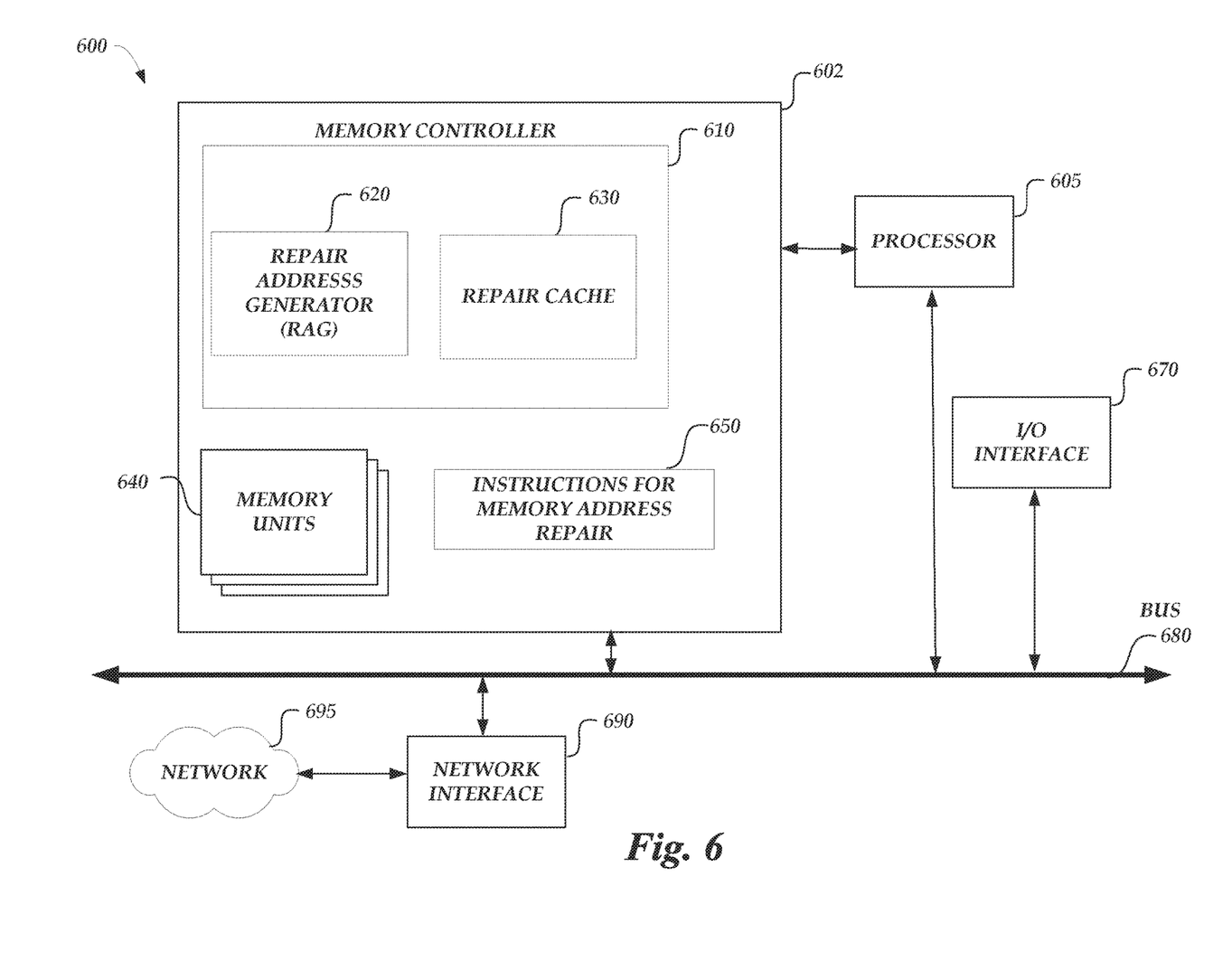
FIG. 6 is a block diagram of a computing system arranged in accordance with examples described herein.

FIG. 6 is a schematic illustration of a computing system 600 arranged in accordance with examples described herein. The computing system 600 may operate in accordance with any embodiment described herein, such as computing system 100. The computing system also includes a processor 605, and I/O interface 670, an internal bus 680, a network interface 690 coupled to a network 695, and memory units 640 coupled to the bus 680. Processor 605 may include any type of microprocessor, central processing unit (CPU), an application specific integrated circuits (ASIC), a digital signal processor (DSP) implemented as part of a field-programmable gate array (FPGA), a system-on-chip (SoC), or other hardware to provide processing for system 600.

The computing system 100 also includes a computing device 602 that may be a smartphone, a wearable electronic device, a server, a computer, an appliance, a vehicle, or any type of electronic device. The computing device 602 includes a memory controller 610 having a repair address generator 620 and a repair cache 630, with both operating according to the functionality described herein with respect to a repair address generator 120 and a repair register 214. The computing device 602 also includes memory units 640 that may operate and be configured like the memory units 140 of FIG. 1, the memory unit 240 of FIG. 2, or the memory unit 340 of FIG. 3.

The computing device 602 may also include a local memory 650, which may be a non-transitory hardware readable medium 550 including instructions for memory address repair, such as implemented by methods 400 and/or 500. For example, the local memory 650 may store instructions for a program that executes the method 400 or the method 500, for example. Communications between the processor 605, the I/O interface 670, and the network interface 690 are provided via a processor internal bus 680. The memory controller 610 may execute repair operations, according to the executable instructions stored in memory 650, which cause the computing device 602 to access the repair cache 630 or repair the memory units 640.

Bus 680 may include one or more physical buses, communication lines/interfaces, and/or point-to-point connections, such as Peripheral Component Interconnect (PCI) bus. The I/O interface 670 can include various user interfaces including video and/or audio interfaces for the user, such as a tablet display with a microphone. Network interface 690 communications with other computing devices, such as computing system 600 or a cloud-computing server, over the network 695. For example, the network interface 690 may be a USB interface.

Figure 7:
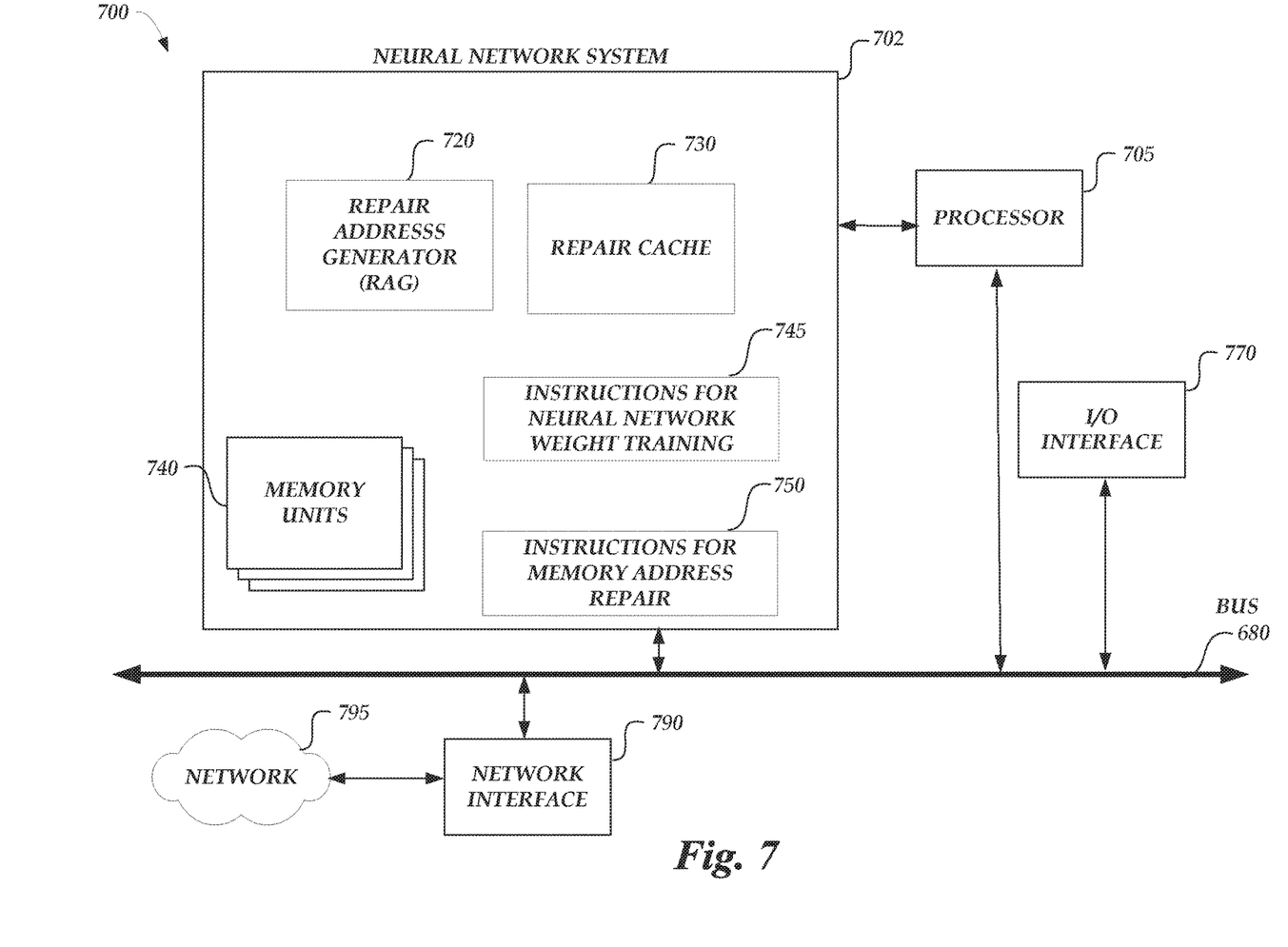
FIG. 7 is a block diagram of a neural network arranged in accordance with examples described herein.

FIG. 7 is a schematic illustration of a neural network system 702 arranged in accordance with examples described herein. The computing system 700 may operate in accordance with any embodiment described herein, such as computing system 100. For the other similarly numbered elements of FIG. 7, such elements include analogous functionality to those numbered elements of FIG. 6. The computing system 700 includes a neural network system 702 that may be implemented on a device having a processor, such as a smartphone, a wearable electronic device, a server, a computer, an appliance, a vehicle, or any type of electronic device. For example, the neural network system 702 may be implemented on any type of microprocessor, central processing unit (CPU), an application specific integrated circuits (ASIC), a digital signal processor (DSP) implemented as part of a field-programmable gate array (FPGA), a system-on-chip (SoC), or other hardware to provide processing for computing device 602. In some examples, the neural network system may be implemented on the processor 705. The neural network system 702 may train and store weights for learning operations, utilizing memory access operations, to be executed on the neural network system 702.

The neural network system 702 also includes a repair address generator 720 and a repair cache 730, with both operating according to the functionality described herein with respect to a repair address generator 120 and a repair register 214. The neural network system 702 also includes memory units 740 that may operate and be configured like the memory units 140 of FIG. 1, the memory unit 240 of FIG. 2, or the memory unit 340 of FIG. 3.

The neural network system 702 may also include a local memory 745, which may be a non-transitory hardware readable medium 745 including instructions for neural network weight training. For example, the neural network system 702 may execute the instructions for weight training, such that calibration data received from the network 795 or the I/O interface 770, may train weights according to an optimization scheme for that neural network (e.g., a least-squares algorithm for training weights). Having trained the weights, the neural network system 702 may store the trained weights, according to the instructions for weight training 745 in the memory units 740.

Additionally or alternatively, the neutral network system 702 may include local memory 750, which may be a non-transitory hardware readable medium 750 including instructions for memory address repair, such as implemented by methods 400 and/or 500. For example, the local memory 750 may store instructions for a program that executes the method 400 or the method 500, for example. The neural network system 702 may execute repair operations, according to the executable instructions stored in memory 750, which cause the neural network system 702 to access the repair cache 730 or repair the memory units 740.

The various illustrative blocks and modules described in connection with the disclosure herein may be implemented or performed with a general-purpose processor, a digital signal processor (DSP), an application-specific integrated circuit (ASIC), a field-programmable gate array (FPGA), or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, RO electrically erasable programmable read only memory (EEPROM), or optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Combinations of the above are also included within the scope of computer-readable media.

Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing it will be appreciated that, although specific examples have been described herein for purposes of illustration, various modifications may be made while remaining with the scope of the claimed technology. The description herein is provided to enable a person skilled in the art to make or use the disclosure. In some instances, well-known wireless communication components, circuits, control signals, timing protocols, computing system components, and software operations have not been shown in detail in order to avoid unnecessarily obscuring the described embodiments of the present disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method comprising:
   obtaining a memory access pattern associated with a plurality of memory access operations, the memory access pattern indicative of first regions of the memory unit that are accessed for data more frequently than second regions of the memory unit where data is stored for weights of a neural network, the second regions of the memory unit identified as associated with a specified error rate for storing the weights of the neural network;
   obtaining a plurality of memory commands associated with the plurality of memory access operations, at least a portion of the plurality of memory access operations associated with the specified error rate for storing the weights of the neural network;
   generating a memory address map for the plurality of memory access operations based on the first regions of the memory unit and the second regions of the memory unit identified as associated with the specified error rate for storing the weights of the neural network; and
   providing the memory address map to a memory data register of a memory unit, the memory data register accessible by the memory unit for repairing the first regions of the memory unit and at least one region of the second regions of the memory unit.

2. The method of claim 1, further comprising:
   accessing the second regions of the memory unit to implement at least one memory command of the plurality of memory commands based on the memory address map, the second regions of memory associated with the specified error rate for at least the portion of the plurality of memory access operations; and
   accessing the first regions of the memory unit to implement another memory command of the plurality of memory commands.

3. The method of claim 1, wherein the memory data register accessible by the memory unit corresponds to a register or local cache of the memory unit.

4. The method of claim 1, wherein the specified error rate corresponds to a threshold error rate for storing the weights of the neural network.

5. The method of claim 4, wherein the threshold error rate for storing the weights of the neural network is based on a bit flip tolerance of the neural network.

6. The method of claim 1, further comprising:
   identifying, in the memory address pattern, a first portion of memory addresses associated with the first regions of the memory unit being accessed more frequently than the second regions of the memory unit as a high priority level of the memory address map; and
   identifying, in the memory address pattern, a second portion of memory addresses associated with the second regions of the memory unit, as a low priority level of the memory address map.

7. The method of claim 6, further comprising:
   identifying, in the first portion of memory addresses as the high priority level, most significant bits of each memory address of the first portion of the memory addresses; and
   aligning, in the memory address map, each memory address of the first portion of memory addresses with a memory identifier of the memory address.

8. The method of claim 7, wherein the memory identifier corresponds to a page of the memory unit or a block of the memory unit.

9. The method of claim 1, wherein the memory unit corresponds to at least one of a DRAM, an SRAM, a NAND, resistive memory, or phase change memory, or any combination thereof.

10. An apparatus comprising:
a memory array comprising a plurality of memory cells including at least one defective memory cell, each defective memory cell having a defective memory address;
a register configured to store a memory address map including a plurality of memory addresses and indicating which of the plurality of memory addresses are associated with a high priority level and which are associated with a low priority level wherein the high priority level indicative of first memory addresses having a default error rate, and wherein the low priority level indicative of second memory addressing having a specified error rate, wherein the default error rate is different than the specified error rate;
a memory controller coupled to the memory array and configured to:
provide the memory address map to the repair register;
compare the defective memory addresses of the defective memory cells to the memory address map; and
based on the comparison of the defective memory addresses of the defective memory cells to the memory address map, repair the first memory addresses associated with the high priority level and at least one memory address of the second memory addresses associated with the low priority level; and
a fuse circuit configured to store the defective memory addresses.

11. The apparatus of claim 10, wherein the fuse circuit comprises:
a plurality of fuse elements each corresponding to a bit of a plurality of bits of the defective address.

12. The apparatus of claim 10, wherein the memory controller is further configured to:
identify the defective memory addresses stored in the fuse circuit.

13. The apparatus of claim 10, wherein the memory controller is further configured to:
determine that a portion of repairs of the memory addresses associated with the high priority level are complete in a first region of the memory array; and
repair the at least one memory address of the memory addresses associated with the low priority level in a second region of memory array having a specified error rate for certain memory access operations.

14. The apparatus of claim 13, wherein each memory access operation of the certain memory access operations comprises an instruction for a respective address of a memory cell of the plurality of memory cells.

15. The apparatus of claim 13, wherein the memory controller is further configured to:
determine that, in repairing the at least one memory address of the memory addresses associated with the low priority level, a fuse element threshold has been passed; and
repair an additional portion of memory addresses associated with the high priority level in a third region of the memory array.

16. The apparatus of claim 10, wherein the memory controller is further configured to:
determine that a portion of repairs of the memory addresses associated with the high priority level are not complete in a first region of the memory array; and
fail the first region of memory array.

17. The apparatus of claim 10, further comprising:
a processor or host device coupled with the memory controller, wherein the memory controller is configured to receive memory commands from the processor or the host device.

18. The apparatus of claim 10, further comprising:
a memory interface coupled to the memory controller and configured to communicate with the memory array, wherein the memory controller is configured to provide the memory map to the memory array via the memory interface.

19. A method comprising:
providing a memory address map to a register accessible by a memory unit;
comparing one or more addresses of defective memory cells of the memory unit to the memory address map that includes a plurality of memory addresses, and indicating which of a plurality of memory addresses are associated with a high priority level having a default error rate, and which are associated with a low priority level, the low priority level indicative of which memory addresses are to be accessed for a plurality of memory access operations associated with a specified error rate, wherein the default error rate is different than the specified error rate; and
repairing the memory addresses associated with the high priority level and at least one memory address of the memory addresses associated with the low priority level based at least in part on the comparing.

20. The method of claim 19, wherein the specified error rate corresponds to a threshold error rate for storing weights of a neural network.

21. The method of claim 20, further comprising repairing a memory address indicative of a most significant bit of a weight of the weights of the neural network.

22. The method of claim 19, further comprising:
blowing a fuse element of a plurality of fuse elements corresponding to the most significant bit of the weight.

23. The method of claim 19, wherein the plurality of memory addresses corresponds to physical memory addresses or virtual memory addresses.

24. The method of claim 19, further comprising:
responsive to a memory access operation of the plurality of memory access operations, accessing a plurality of memory cells according to repaired memory addresses indicative of the at least one memory address of the memory addresses associated with the low priority level.

25. An apparatus comprising:
a memory array comprising a plurality of memory cells including at least one defective memory cell of a plurality of defective memory cells having a specified error rate in first regions of memory array that are accessed, in a memory access pattern of the memory array, less frequently than second regions of the memory array that are accessed for data; and
a non-transitory computer readable medium encoded with executable instructions, which, when executed, cause the apparatus to identify weights for use in a neural network and to store the weights of the neural network in the at least one defective memory cell of the plurality of defective memory cells having the specified error rate in the first regions of the memory array, wherein at least one least significant bits of a respective weights is stored in a corresponding defective memory cell of the plurality of defective memory cells.

26. The apparatus of claim 25, wherein the specified error rate corresponds to a first threshold error rate for storing the weights of the neural network associated with access operations at the memory array.

27. The apparatus of claim 26, wherein the first threshold error rate for storing weights of the neural network is different than a second threshold error rate associated with additional access operations in the second regions of the memory array that are accessed for data.

28. The apparatus of claim 27, wherein the non-transitory computer readable medium is further encoded with executable instructions, which, when executed, cause the neural network to repair a portion of memory addresses associated with the access operations and to repair memory addresses associated with the additional access operations.

* * * * *

UNITED STATES PATENT AND TRADEMARK OFFICE
CERTIFICATE OF CORRECTION

PATENT NO. : 11,183,266 B2
APPLICATION NO. : 16/453905
DATED : November 23, 2021
INVENTOR(S) : Hulton et al.

Page 1 of 1

It is certified that error appears in the above-identified patent and that said Letters Patent is hereby corrected as shown below:

In the Claims

Column 19, Line 1 Claim 25 delete "one least significant bits of a respective weights" and insert -- one least significant bit of a respective weight --

Signed and Sealed this
Fourth Day of January, 2022

Drew Hirshfeld
*Performing the Functions and Duties of the*
*Under Secretary of Commerce for Intellectual Property and*
*Director of the United States Patent and Trademark Office*